United States Patent [19]
Fukui et al.

[11] Patent Number: 5,916,728
[45] Date of Patent: Jun. 29, 1999

[54] POSITIVE RESIST COMPOSITION

[75] Inventors: Nobuhito Fukui; Yuko Yako; Hiroshi Takagaki; Kenji Takahashi, all of Osaka, Japan

[73] Assignee: Sumitomo Chemical Company, Limited, Osaka, Japan

[21] Appl. No.: 08/950,754

[22] Filed: Oct. 15, 1997

[30] Foreign Application Priority Data

Oct. 16, 1996 [JP] Japan ................................ 8-273332

[51] Int. Cl.$^6$ ............................................ G03F 7/004
[52] U.S. Cl. .................... 430/170; 430/270.1; 430/905
[58] Field of Search ............................. 430/170, 270.1, 430/905

[56] References Cited

U.S. PATENT DOCUMENTS

| | | | |
|---|---|---|---|
| 5,320,931 | 6/1994 | Umehara et al. | 430/270.1 |
| 5,403,695 | 4/1995 | Hayase et al. | 430/192 |
| 5,658,706 | 8/1997 | Niki et al. | 430/270.1 |

FOREIGN PATENT DOCUMENTS

| | | |
|---|---|---|
| 05 37524 A1 | 4/1993 | European Pat. Off. . |
| 05 58280 A1 | 9/1993 | European Pat. Off. . |
| 06 60187 A1 | 6/1995 | European Pat. Off. . |

*Primary Examiner*—John S. Chu
*Attorney, Agent, or Firm*—Birch, Stewart, Kolasch & Birch, LLP

[57] ABSTRACT

A positive photo resist composition of chemical amplifying type, which is excellent in various properties such as sensitivity resolution, heat resistance, film retention ratio, applicability and profile and also excellent in time delay effect resistance, and which comprises (A) a resin which is converted to alkali-soluble from alkali-insoluble or alkali-slightly soluble by the action of an acid, (B) an acid generator and (C) a tertiary amine compound having an aliphatic hydroxyl group.

13 Claims, No Drawings

POSITIVE RESIST COMPOSITION

The present invention relates to a chemical amplifying type positive resist composition suitable for lithography, which uses a high energy radiation such as a far ultraviolet ray (including eximer laser and the like), electron beam, X-ray or radiation light.

Recently, with increases the in degree of integration of an integrated circuit, submicron patterning has become required in industry. In particular, eximer laser lithography is drawing attention since it enables production of 64M DRAM (mega bit random access memory) and 256M DRAM. As a resist suitable for such an eximer laser lithography process, there is suggested a so-called chemical amplifying type resist utilizing an acid catalyst and chemical amplifying effect. In a chemical amplifying type resist, the solubility of irradiated parts against an alkali developer is changed by a reaction utilizing an acid, as catalyst, generated from an acid generator by irradiation. A positive or negative pattern is obtained by this reaction.

In a chemical amplifying type resist, an acid generated in the irradiated parts is diffused in the subsequent thermal treatment (post exposure bake: hereinafter abbreviated as PEB) and acts as a catalyst to change the solubility of irradiated parts against a developer. However, there is a problem that this chemical amplifying type resist is liable to be influenced by certain circumstances. For example, the performance of the resist varies depending on leaving time from irradiation to PEB. This phenomenon is called time delay effect. The time delay effect lowers the resolution. Further more, due to the time delay effect, a slightly soluble layer against an alkali developer is formed on the surface of a resist film and, as a result, a pattern after developing become T-shape which deteriorates reproducibility of dimension of the pattern. The time delay effect is said to be caused by deactivation of an acid generated in a resist due to small amount of amines existing in surrounding atmosphere, etc.

For suppressing the time delay effect, namely to promote time delay effect resistance (hereinafter, referred to as TDE resistance), it is known to add a nitrogen-containing compound as a quencher to a chemical amplifying type positive resist. Though TDE resistance increases to a certain extent by the addition of a nitrogen-containing compound as a quencher, the increase of the TDE resistance, profile and resolution are still insufficient for a conventionally known resist composition.

The object of the present invention is to provide a chemical amplifying type positive resist composition, which is good in various properties such as sensitivity, resolution, heat resistance, film retention ratio, applicability and profile as well as is excellent in TDE resistance. The present inventors have intensively studied to attain said object, and as a result, have found that said object can be attained by a positive photo resist composition comprising certain specific components as a quencher. Thus, the present invention was completed.

The present invention provides a positive photo resist composition comprising (A) a resin which is converted to alkali-soluble from alkali-insoluble or alkali-slightly soluble by the action of an acid, (B) an acid generator, and (C) a tertiary amine compound having an aliphatic hydroxyl group.

By containing the tertiary amine compound having an aliphatic hydroxyl group (C) in the positive photo resist composition, its resolution, profile and TDE resistance are particularly improved. Further, it is also effective for the positive photo resist composition to comprise an electron donor (D) having an oxidation-reduction potential of not more than 1.7 eV in addition to the above-described three components (A), (B) and (C).

The resin (A), which is a main component of the photo resist composition, is insoluble or slightly soluble itself against an alkali. However, it becomes alkali soluble by chemical reaction caused by an action of an acid. Examples of the resin (A) include a resin which is produced from an alkali-soluble resin having a phenol skeleton by protecting at least a part of the phenolic hydroxyl groups by a group which has dissolution inhibiting ability against an alkali developer and is instable against an acid.

Examples of the alkali-soluble resin which is used for producing the resin (A) include novolak resins, polyvinylphenol resin, polyisopropenylphenol resin, copolymers of vinylphenol with styrene, acrylonitrile, methylmethacrylate or methylacrylate, and copolymers of isopropenylphenol with styrene, acrylonitrile, methylmethacrylate or methylacrylate. Although the relative positional relation between a hydroxyl group and a vinyl group or an isopropenyl group in vinylphenol and isopropenylphenol is not particularly limited, in general, p-vinylphenol or p-isopropenylphenol is preferred. These resins may be hydrogenated to improve transparency. Further, an alkyl group or alkoxyl group may be introduced into the phenol nucleus of the above-described resin as long as the resin is alkali-soluble. Among these alkali-soluble resins, polyvinylphenol-based resins, namely, a homopolymer of vinylphenol or copolymers of vinylphenol with the other monomers are preferably used.

The group which has dissolution inhibiting ability against an alkali developer and is instable against an acid, which is introduced in the alkali-soluble resin, can be selected from various known protecting groups. Examples thereof include tert-butoxycarbonyl group, tert-butoxycarbonylmethyl group, tetrahydro-2-pyranyl group, tetrahydro-2-furyl group, methoxymethyl group and 1-ethoxyethyl group. Among these protecting groups, 1-ethoxyethyl group is particularly preferred in the present invention. The hydrogen atoms of the phenolic hydroxyl group of an alkali-soluble resin having a phenol skeleton is substituted by one of these protecting groups. The ratio of phenolic hydroxyl groups which are substituted by a protecting group to total phenolic groups (protecting group introduction ratio) in the alkali-soluble resin is preferably from 10 to 50% in general.

In the present inventions it is preferable that at least a part of resin (A) is polyvinylphenol-based resin in which the phenolic hydroxyl group is partially protected by a group which has dissolution inhibiting ability against an alkali developer and is instable against an acid, particularly preferable by 1-ethoxyethyl group.

The acid generator (B) can be selected from various compounds which generate acid by irradiating a radiation onto the substance. The acid generator (B) can be used singly or as a mixture of two or more thereof. Examples thereof include onium salts, organic halogen compounds, compounds containing a diazomethanedisulfonyl skeleton, disulfone-based compounds, orthoquinonediazide compound and sulfonic acid-based compounds. Among them, compounds containing a diazomethanedisulfonyl skeleton and sulfonic acid-based compounds are preferred in the present invention.

Examples of the compounds having a diazomethanedisulfonyl skeleton usable as the acid generator (B) include bis (cyclohexylsulfonyl) diazomethane, bis (phenylsulfonyl)

diazomethane, bis (p-tolylsulfonyl) diazomethane and bis (2,4-xylylsulfonyl) diazomethane.

Examples of the sulfonic acid-based compound usable as the acid generator (B) include esters of alkylsulfonic acids, esters of haloalkylsulfonic acids, esters of arylsulfonic acids and esters of camphorsulfonic acids. Examples of alcohol moiety of the above-described esters include pyrogallol, 2- or 4-nitrobenzyl alcohol, 2,6-dinitrobenzyl alcohol. N-hydroxyimide compounds and oxime-based compounds. Among the sulfonic acid-based compound, a sulfonic acid ester of N-hydroxyimide compounds is more preferred as the acid generator (B). Examples of the sulfonic acid-based compounds usable as the acid generator (B) further include N- (phenylsulfonyloxy)succinimide, N- (methylsulfonyloxy) succinimide, N- (trifluoromethylsulfonyloxy) succinimide, N- (ethylsulfonyloxy) succinimide, N- (butylsuofonyloxy) succinimide, N- (10-camphorsulfonyloxy) succinimide, N- (trifluoromethylsulfonyloxy) phthalimide, N- (trifluoromethylsulfonyloxy) naphthalimide, 2-nitrobenzyl p-toluenesulfonate, 4-nitrobenzyl p-toluenesulfonate, 2,6-dinitrobenzyl p-toluenesulfonate, 1,2,3-benzenetriyl trismethanesulfonate, 1-benzoyl-1-phenylmethyl p-toluenesulfonate (so-called benzointosylate), 2-benzoyl-2-hydroxy-2-phenylethyl p-toluenesulfonate (so-called α-methlolbenzointosylate) and α-(p-tolylsulfonyloxyimino)-4-methoxyphenylacetonitrile having the following structure:

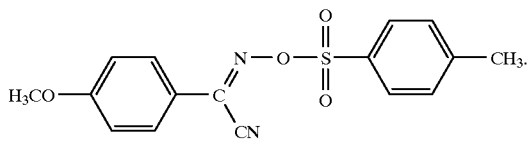

The photo resist composition of the present invention comprises a tertiary amine compound having an aliphatic hydroxyl group (C) as a quencher in addition to the above-described resin (A) and the acid generating agent (B).

The term "aliphatic hydroxyl group" means an alcoholic hydroxyl group, i.e. a hydroxyl group bonded to an aliphatic carbon. As the tertiary amine (C), tertiary amines which do not evaporate at the pre-bake temperature in order to remain in the resist film after pre-bake and gives exhibit their effects. In general, tertiary amines having the boiling temperature of not less than 150° C. are used as the tertiary amine (C).

The tertiary amine (C) may also have an aromatic group, etc. as long as it has a tertiary nitrogen atom and a hydroxyl group bonding to an aliphatic carbon. For example, the tertiary amine (C) may be represented by the following formula (I):

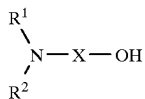

wherein X represents a divalent aliphatic group; and $R^1$ and $R^2$ independently represent a monovalent aliphatic or aromatic group, or $R^1$ and $R^2$ may form a ring together with the nitrogen atom to which they are bonded, or $R^1$ and a carbon atom in X may form a ring together with the nitrogen atom to which they are bonded.

Typical examples of the divalent aliphatic group represented by X in the formula (I) include an alkylene group having about 1–6 carbon atom. The alkylene group may optionally be substituted by a substituent such as hydroxyl. Typical examples of the monovalent aliphatic group represented by $R^1$ or $R^2$ in the formula (I) include an alkyl group having about 1–6 carbon atom. The alkyl group may optionally be substituted by a substituent such as hydroxyl. Typical examples of the monovalent aromatic group represented by $R^1$ or $R^2$ in the formula (I) include a phenyl group which may optionally be substituted by a substituent such as alkyl. Examples of the ring formed by $R^1$, $R^2$ and the nitrogen atom to which they are bonded and examples of the ring formed by $R^1$, a carbon atom in X and the nitrogen atom to which they are bonded include a five-member ring such as a pyrrolidine ring and a six-member ring such as a piperidine ring or a morpholine ring. These rings may be optionally substituted by a substituent such as alkyl or hydroxyalkyl. These rings may optionally have a hetero atom other than the nitrogen atom to which $R^1$, $R^2$ and/or X are bonded, such as another nitrogen atom, an oxygen atom or a sulfur atom.

More specific examples of the tertiary amine compound (C) include N,N-di-substituted amino alkanol, N-substituted dialkanolamine, N,N-di-substituted amino alkanediol, trialkanolamine and a heterocyclic compound having an aliphatic hydroxyl group and a tertiary nitrogen atom in the ring. Examples of the heterocyclic compound having an aliphatic hydroxyl group and a tertiary nitrogen atom in the ring include N-substituted pyrrolidine compound, N-substituted piperidine compound and N-substituted morpholine compound. Further more specific examples of the tertiary amine compound (C) include:

2- (N-methylanilino)ethanol,
2- (N-ethylanilino)ethanol,
N-phenyldiethanolamine,
N-phenyldiisopropanolamine,
2-diethylaminoethanol,
1-diethylamino-2-propanol,
3-diethylamino-1-propanol,
3-diethylamino-1,2-propane diol,
1-dimethylamino-2-propanol,
3-dimethylamino-1-propanol,
3-dimethylamino-1 2-propane diol,
2-dimethylamino-2-methyl-1-propanol
3-dimethylamino-2,2-dimethyl-1-propanol,
4-dimethylamino-1-butanol,
triisopropanol amine,
1- (2-hydroxyethyl)piperidine,
1- (2-hydroxyethyl)pyrrolidine,
N- (2-hydroxyethyl)morpholine,
1- (2-hydroxyethyl)-4- (3-hydroxypropyl)piperidine and
2- (2-hydroxyethyl)-1-methylpyrrolidine.

Among them, N-phenyldiethanolamine, 2-diethylaminoethanol, 2- (N-ethylanilino)ethanol, triisopropanol amine, 1- (2-hydroxyethyl)pyrrolidine and N-(2-hydroxyethyl)morpholine are preferred.

The positive resist composition of the present invention essentially comprises the above-described resin (A), acid generator (B) and tertiary amine compound having an aliphatic hydroxyl group (C). The positive photo resist composition of the present invention may further contain the other additional components. As the additional component, an electron donor (D) is preferably used. Among the electron donor (D), an electron donor having a oxidation-reduction potential of not more than 1.7 eV is particularly preferred.

Examples of the electron donor include condensed polycyclic aromatic compounds and hetero polycyclic aromatic compounds. Examples of the more preferred electron donor include 2-hydroxylcarbazol, β-naphthol, 4-methoxynaphthol and indol acetic acid. These electron donors can be used alone or in combination of two or more. The decomposition reaction of the acid generator (B) caused by electron transfer is often promoted by the existence of the electron donor in a certain composition.

The composition ratio of the resin (A) in the positive photo resist composition of the present invention is preferably 20 to 98% by weight, more preferably 75 to 98% by weight, based on weight of the total solid component of the composition. The composition ratio of the acid generator (B) in the positive photo resist composition is preferably 0.05 to 20% by weight based on weight of the total solid component of the composition. The composition ratio of the tertiary amine compound having an aliphatic hydroxyl group (C) in the positive photo resist composition is preferably 0.001 to 10% by weight based on weight of the total solid component of the composition. When the electron donor (D) is used, the composition ratio of the electron donor (D) in the positive photo resist composition is 0.001 to 10% by weight based on the total solid component weight of the composition. The photo resist composition of the present invention may further optionally contain various additives conventionally used in this field such as dissolution inhibitor, sensitizers, dyes or adhesion improvers.

A resist solution is prepared by mixing the above-described components with a solvent so that the total solid component concentration is from 10 to 50% by weight. The solution thus prepared is applied on a substrate such as a silicon wafer. The solvent herein used may be one which can solve the all of the components, and can be one which is generally used in this field. Examples thereof include glycol ether esters such as ethylcellosolve acetate, methylcellosolve acetate, propylene glycolmonomethyl ether acetate and propylene glycol monoethyl ether acetate, glycol mono or diethers such as ethylcellosolve, methylcellosolve, propylene glycol monomethyl ether, propylene glycol monoethyl ether and diethylene glycol dimethyl ether, esters such as ethyl lactate, butyl acetate and ethyl pyruvate, ketones such as 2-heptanone, cyclohexanone and methyl isobutyl ketone, and aromatic hydrocarbons such as xylene. These solvents can be used alone or in combination of two or more.

From the resultant resist film applied on a substrate, a positive pattern is formed generally via subsequent processes such as prebake, patterning exposures PEB, and developing by an alkali developer. In the alkali developing, various alkaline aqueous solutions used in this field can be used. And in general, aqueous solutions such as tetramethylammoniumhydroxide and (2-hydroxyethyl) trimethylamnmoniumhydroxide (so-called choline hydroxide) are often used.

The following examples further illustrate the present invention in detail but are not to be construed to limit the scope thereof. In the examples, all parts are by weight unless otherwise state.

REFERENCE EXAMPLE 1 (Protection of Resin)

Into a 500 ml four-necked flask purged with nitrogen were charged 25 g of poly (p-vinylphenol) ["VP-5000" manufactured by Nippon Soda K.K.] having a weight average molecular weight (Mw) of 8400 and a dispersion degree (Mw/Mn) of 1.19 (208 mmol as p-vinylphenol unit) and 0.024 g (0.125 mmol) of p-toluenesulfonic acid, and they were dissolved in 250 g of 1,4-dioxane. To this solution was added dropwise 9.0 g (125 mmol) of ethylvinyl ether, and then reaction was carried out for 5 hours at 25° C. This reaction solution was added dropwise into 1500 ml of ion-exchanged water, then separated by filtration to obtain a white wet cake. This wet cake was dissolved again in 200 g of 1,4-dioxane, and the resulting solution was added dropwise into 1500 ml of ion-exchanged water. The resulting mixture was separated by filtration. The wet cake thus obtained was washed by being stirred with 600 g of ion-exchanged water, followed by being filtered to obtain a wet cake. The washing operation with this ion-exchanged water was further repeated twice. The resulting white wet cake was dried under reduced pressure to obtain a resin in which the hydroxyl group of poly (p-vinylphenol) was partially 1-ethoxyethyl etherized. This resin was analyzed by $^1$H-NMR to find that 40% of the hydroxyl group was protected by a 1-ethoxylethyl group. This resin has a weight average molecular weight of 12300 and a dispersion degree of 1.23.

REFERENCE EXAMPLE 2

The same procedure as in Reference Example 1 was repeated except that poly (p-vinylphenol)["VP-15000" manufactured by Nippon Soda K.K.] having a weight average molecular weight of 23900 and a dispersion degree of 1.12 was used in the same amount instead of "VP-5000", the amount of p-toluenesulfonic acid was changed to 0.021 g (0.109 mmol) and the amount of ethylvinyl ether was changed to 7.88 g (109 mmol) to obtain a resin in which the hydroxyl group of poly (p-vinylphenol) was partially 1-ethoxyethyl etherized. This resin was analyzed by $^1$H-NMR to find that 35% of the hydroxyl group was protected by a 1-ethoxylethyl group. This resin has a weight average molecular weight of 31200 and a dispersion degree of 1.17.

EXAMPLE 1

The resin synthesized in Reference Example 1 (13.5 parts) 1.0 part of N- (10-camphorsulfonyloxy) succinimide as an acid generator and 0.012 parts of N-phenyldiethanolamine were dissolved in 65 parts of propylene glycol monomethyl ether acetate. This solution was filtered through a filter made of a fluorine resin having a pore diameter of 0.1 μm to prepare a resist solution.

On a silicone wafer washed by conventional way, the above-described resist solution was applied using a spin coater so that a film thickness after drying is 0.7 μm. Then, this silicon wafer was prebaked at 90° C. for 90 seconds on a hot plate. The film after the prebake was subjected to irradiation treatment using KrF eximer laser stepper ("NSR-1755 EX8A" manufactured by Nikon Corp. NA=0.45) having an irradiation wave length of 248 nm through a chromium mask having a pattern with changing irradiation amount stepwise. Immediately, or after left for 30 minutes in a clean room having an amine concentration of 2 to 3 ppb, the irradiated wafer was heated for 90 seconds at 100° C. on a hot plate for carrying out PEB to conduct deprotection reaction in the irradiated parts. This was developed with a 2.38% by weight aqueous solution of tetramethylammoniumhydroxide to obtain a positive pattern.

The formed pattern was observed by an electron microscope. Regarding the sample which was subjected to PEB immediately after irradiation, 0.23 μm fine pattern with excellent profile was formed at a irradiation amount of 28 mJ/cm$^2$. Regarding the sample which was subjected to PEB after left for 30 minutes after irradiation, 0.23 μm fine pattern with excellent profile was formed at a irradiation amount of 28 mJ/cm² likewise.

EXAMPLE 2

The resin synthesized in Reference Example 1 (13.5 parts), 1.0 part of N- (10-camphorsulfonyloxy) succinimide as an acid generator, 0.025 parts of N-phenyldiethanolamine and 0.2 parts of 2-hydroxycarbazole as an electron donor were dissolved in 65 parts of propylene glycol monomethyl ether acetate. This solution was filtered through a filter made of a fluorine resin having a pore diameter of 0.1 µm to prepare a resist solution. The same procedure as in Example 1 was repeated using this resist solution, and the formed pattern was observed by an electron microscope. Regarding the sample which was subjected to PEB immediately after irradiation, 0.22 µm fine pattern with excellent profile was formed at a irradiation amount of 30 mJ/cm². Regarding the sample which was subjected to PEB after left for 30 minutes after irradiation, 0.22 µm fine pattern with excellent profile was formed at a irradiation amount of 30 mJ/cm² likewise.

EXAMPLE 3

The resin synthesized in Reference Example 2 (13.5 parts), 0.5 part of N- (10-camphorsulfonyloxy) succinimide and 0.1 part of N- (ethylsulfonyloxy) succinimide as an acid generator, 0.018 parts of N-phenyldiethanolamine and 0.2 parts of 2-hydroxycarbazole as an electron donor were dissolved in 70 parts of propylene glycol monomethyl ether acetate. This solution was filtered through a filter made of a fluorine resin having a pore diameter of 0.1 µm to prepare a resist solution. The same procedure as in Example 1 was repeated using this resist solution, and the formed pattern was observed by an electron microscope. Regarding the sample which was subjected to PEB immediately after irradiation, 0.23 µm fine pattern with excellent profile was formed at a irradiation amount of 22 mJ/cm². Regarding the sample which was subjected to PEB after left for 30 minutes after irradiation, 0.23 µm fine pattern with excellent profile was formed at a irradiation amount of 22 mJ/cm² likewise.

EXAMPLE 4

The resin synthesized in Reference Example 2 (13.5 parts), 0.5 part of N- (10-camphorsulfonyloxy) succinimide and 0.1 part of N- (ethylsulfonyloxy) succinimide as an acid generator, 0.018 parts of N-phenyldiethanolamine and 0.2 parts of 4-methoxy-1-naphthol as an electron donor were dissolved in 70 parts of propylene glycol monomethyl ether acetate. This solution was filtered through a filter made of a fluorine resin having a pore diameter of 0.1 µm to prepare a resist solution. The same procedure as in Example 1 was repeated using this resist solution, and the formed pattern was observed by an electron microscope. Regarding the sample which was subjected to PEB immediately after irradiation, 0.23 µm fine pattern with excellent profile was formed at a irradiation amount of 26 mJ/cm². Regarding the sample which was subjected to PEB after left for 30 minutes after irradiation, 0.23 µm fine pattern with excellent profile was formed at a irradiation amount of 26 mJ/cm² likewise.

EXAMPLE 5

The resin synthesized in Reference Example 1 (13.5 parts), 1.0 part of N- (10-camphorsulfonyloxy) succinimide as an acid generator and 0.1 parts of 2-diethylaminoethanol were dissolved in 65 parts of propylene glycol monomethyl ether acetate. This solution was filtered through a filter made of a fluorine resin having a pore diameter of 0.1 µm to prepare a resist solution. The same procedure as in Example 1 was repeated using this resist solution, and the formed pattern was observed by an electron microscope. Regarding the sample which was subjected to PEB immediately after irradiation, 0.24 µm fine pattern with excellent profile was formed at a irradiation amount of 33 mJ/cm². Regarding the sample which was subjected to PEB after left for 30 minutes after irradiation, 0.24 µm fine pattern with excellent profile was formed at a irradiation amount of 33 mJ/cm² likewise.

EXAMPLE 6

The resin synthesized in Reference Example 1 (13.5 parts), 1.0 part of N- (10-camphorsulfonyloxy) succinimide as an acid generator and 0.1 part of 1- (2-hydroxyethyl) pyrrolidine were dissolved in 65 parts of propylene glycol monomethyl ether acetate. This solution was filtered through a filter made of a fluorine resin having a pore diameter of 0.1 µm to prepare a resist solution. The same procedure as in Example 1 was repeated using this resist solution, and the formed pattern was observed by an electron microscope. Regarding the sample which was subjected to PEB immediately after irradiation, 0.22 µm fine pattern with excellent profile was formed at a irradiation amount of 26 mJ/cm². Regarding the sample which was subjected to PEB after left for 30 minutes after irradiation, 0.22 µm fine pattern with excellent profile was formed at a irradiation amount of 26 mJ/cm² likewise.

EXAMPLE 7

The resin synthesized in Reference Example 1 (13.5 parts), 1.0 part of N- (10-camphorsulfonyloxy) succinimide as an acid generator and 0.025 part of N- (2-hydroxyethyl) morpholine were dissolved in 65 parts of propylene glycol monomethyl ether acetate. This solution was filtered through a filter made of a fluorine resin having a pore diameter of 0.1 µm to prepare a resist solution. The same procedure as in Example 1 was repeated using this resist solution, and the formed pattern was observed by an electron microscope. Regarding the sample which was subjected to PEB immediately after irradiation, 0.24 µm fine pattern with excellent profile was formed at a irradiation amount of 35 mJ/cm². Regarding the sample which was subjected to PEB after left for 30 minutes after irradiation, 0.24 µm fine pattern with excellent profile was formed at a irradiation amount of 35 mJ/cm² likewise.

EXAMPLE 8

The resin synthesized in Reference Example 1 (13.5 parts), 1.0 part of N- (10-camphorsulfonyloxy) succinimide as an acid generator and 0.01 parts of 2-N-ethylanilinoethanol were dissolved in 65 parts of propylene glycol monomethyl ether acetate. This solution was filtered through a filter made of a fluorine resin having a pore diameter of 0.1 µm to prepare a resist solution. The same procedure as in Example 1 was repeated using this resist solution, and the formed pattern was observed by an electron microscope. Regarding the sample which was subjected to PEB immediately after irradiation, 0.23 µm fine pattern with excellent profile was formed at a irradiation amount of 30 mJ/cm². Regarding the sample which was subjected to PEB after left for 30 minutes after irradiation, 0.23 µm fine pattern with excellent profile was formed at a irradiation amount of 30 mJ/cm² likewise.

EXAMPLE 9

The resin synthesized in Reference Example 2 (13.5 parts), 1.0 part of N- (10-camphorsulfonyloxy) succinimide as an acid generator, 0.03 parts of 2- N-ethylanilinoethanol and 0.2 parts of 2-hydroxycarbazole as an electron donor were dissolved in 65 parts of propylene glycol monomethyl ether acetate. This solution was filtered through a filter made of a fluorine resin having a pore diameter of 0.1 μm to prepare a resist solution. The same procedure as in Example 1 was repeated using this resist solution, and the formed pattern was observed by an electron microscope. Regarding the sample which was subjected to PEB immediately after irradiation, 0.22 μm fine pattern with excellent profile was formed at a irradiation amount of 35 mJ/cm². Regarding the sample which was subjected to PEB after left for 30 minutes after irradiation, 0.22 μm fine pattern with excellent profile was formed at a irradiation amount of 35 mJ/cm² likewise.

EXAMPLE 10

The resin synthesized in Reference Example 2 (13.5 parts) 0.5 part of bis (cyclohexylsulfonyl)diazomethane as an acid generator and 0.015 parts of N-phenyldiethanolamine were dissolved in 70 parts of propylene glycol monomethyl ether acetate. This solution was filtered through a filter made of a fluorine resin having a pore diameter of 0.1 μm to prepare a resist solution. The same procedure as in Example 1 was repeated using this resist solution, and the formed pattern was observed by an electron microscope. Regarding the sample which was subjected to PEB immediately after irradiation, 0.23 μm fine pattern with excellent profile was formed at a irradiation amount of 35 mJ/cm². Regarding the sample which was subjected to PEB after left for 30 minutes after irradiation, 0.23 μm fine pattern with excellent profile was formed at a irradiation amount of 35 mJ/cm² likewise.

EXAMPLE 11

The resin synthesized in Reference Example 2 (13.5 parts), 0.5 part of bis (cyclohexylsulfonyl)diazomethane as an acid generator and 0.01 parts of triisopropanolamine were dissolved in 70 parts of propylene glycol monomethyl ether acetate. This solution was filtered through a filter made of a fluorine resin having a pore diameter of 0.1 μm to prepare a resist solution. The same procedure as in Example 1 was repeated using this resist solution, and the formed pattern was observed by an electron microscope. Regarding the sample which was subjected to PEB immediately after irradiation, 0.24 μm fine pattern with excellent profile was formed at a irradiation amount of 24 mJ/cm². Regarding the sample which was subjected to PEB after left for 30 minutes after irradiation, 0.24 μm fine pattern with excellent profile was formed at a irradiation amount of 24 mJ/cm² likewise.

EXAMPLE 12

The resin synthesized in Reference Example 2 (13.5 parts), 0.5 part of bis (cyclohexylsulfonyl)diazomethane as an acid generator, 0.01 parts of triisopropanolamine and 0.2 parts of 2-hydroxycarbazole as an electron donor were dissolved in 70 parts of propylene glycol monomethyl ether acetate. This solution was filtered through a filter made of a fluorine resin having a pore diameter of 0.1 μm to prepare a resist solution. The same procedure as in Example 1 was repeated using this resist solution, and the formed pattern was observed by an electron microscope. Regarding the sample which was subjected to PEB immediately after irradiation, 0.24 μm fine pattern with excellent profile was formed at a irradiation amount of 35 mJ/cm². Regarding the sample which was subjected to PEB after left for 30 minutes after irradiation, 0.24 μm fine pattern with excellent profile was formed at a irradiation amount of 35 mJ/cm² likewise.

COMPARATIVE EXAMPLE 1

The resin synthesized in Reference Example 1 (13.5 parts), 1.0 part of N- (10-camphorsulfonyloxy) succinimide as an acid generator and 0.1 parts of N-cyclohexylethanolamine were dissolved in 65 parts of propylene glycol monomethyl ether acetate. This solution was filtered through a filter made of a fluorine resin having a pore diameter of 0.1 μm to prepare a resist solution. Application on a silicon wafer, prebake and patterning irradiation were conducted in the same manner as in Example 1 using this resist solution. PEB was conducted for 90 seconds at 100° C. on a hot plate immediately after irradiation, and developing was then conducted in the same manner as in Example 1. The formed pattern was observed by an electron microscope. Only 0.30 μm or larger pattern was resolved. The irradiation amount where the finest pattern (0.30 μm) was resolved was 20 mJ/cm².

COMPARATIVE EXAMPLE 2

The resin synthesized in Reference Example 1 (13.5 parts), 1.0 part of N- (10-camphorsulfonyloxy) succinimide as an acid generator and 0.2 parts of N,N-dimethylaniline were dissolved in 65 parts of propylene glycol monomethyl ether acetate. This solution was filtered through a filter made of a fluorine resin having a pore diameter of 0.1 μm to prepare a resist solution. The same procedure as in Comparative Example 1 was repeated using this resist solution, and the formed pattern was observed by an electron microscope. The formed pattern was observed by an electron microscope. Only 0.30 μm or larger pattern was resolved. The irradiation amount where the finest pattern (0.30 μm) was resolved was 25 mj/cm².

COMPARATIVE EXAMPLE 3

The resin synthesized in Reference Example 1 (13.5 parts), 1.0 part of N- (10-camphorsulfonyloxy) succinimide as an acid generator and 0.2 parts of 6-amino-1-hexanol were dissolved in 65 parts of propylene glycol monomethyl ether acetate. This solution was filtered through a filter made of a fluorine resin having a pore diameter of 0.1 μm to prepare a resist solution. The same procedure as in Comparative Example 1 was repeated using this resist solution, and the formed pattern was observed by an electron microscope. The formed pattern was observed by an electron microscope. Only 0.30 μm or larger pattern was resolved. The irradiation amount where the finest pattern (0.30 μm) was resolved was 25 mJ/cm².

COMPARATIVE EXAMPLE 4

The resin synthesized in Reference Example 2 (13.5 parts), 0.5 part of bis (cyclohexylsulfonyl) diazomethane as an acid generator and 0.03 part of N,N-dimethylbenzylamine were dissolved in 70 parts of propylene glycol monomethyl ether acetate. This solution was filtered through a filter made of a fluorine resin having a pore diameter of 0.1 μm to prepare a resist solution. The same procedure as in Comparative Example 1 was repeated using this resist solution, and the formed pattern was observed by an electron microscope. As a result, though 0.23 μm fine pattern was formed at a irradiation amount of 40 mJ/cm², reduction in film thickness was extreme and profile was poor.

The compositions used in the above-described Examples 1 to 12 and Comparative Example 1 to 4 and the test results thereof are summarized in Table 1. In Table 1, components are represented by the following marks.

(A) Resin
   A1: resin synthesized in Reference Example 1
   A2: resin synthesized in Reference Example 2
(B) Acid generator B1: N- (10-camphorsulfonyloxy) succinimide
   B2: N- (ethylsulfonyloxy) succinimide
   B3: bis (cyclohexylsulfonyl) diazomethane
(C) Amine compound
   C1: N-phenyldiethanolamine
   C2: 2-diethylaminoethanol
   C3: 1- (2-hydroxyethyl)pyrrolidine
   C4: N- (2-hydroxyethyl)morpholine
   C5: 2-N-ethylanilinoethanol
   C6: triisopropanolamine
   CA: N-cyclohexylethanolamine
   CB: N,N-dimethylaniline
   CC: 6-amino-1-hexanol
   CD: N,N-dimethylbenzylamine
(D) Electron donor D1: 2-hydroxycarbazole D2: 4-methoxy-1-naphthol

TABLE 1

| Example No. | Resin (parts) | Acid generator (parts) | Amine compound (parts) | Electron donor (parts) | Sensitivity (mJ/cm$^2$) | Resolution (μm) |
|---|---|---|---|---|---|---|
| Example 1 | A1/13.5 | B1/1.0 | C1/0.012 | — | 28 | 0.23 |
| Example 2 | A1/13.5 | B1/1.0 | C1/0.025 | D1/0.2 | 30 | 0.22 |
| Example 3 | A2/13.5 | B1/0.5 B2/0.1 | C1/0.018 | D1/0.2 | 22 | 0.23 |
| Example 4 | A2/13.5 | B1/0.5 B2/0.1 | C1/0.018 | D2/0.2 | 26 | 0.23 |
| Example 5 | A1/13.5 | B1/1.0 | C2/0.1 | — | 33 | 0.24 |
| Example 6 | A1/13.5 | B1/1.0 | C3/0.1 | — | 26 | 0.22 |
| Example 7 | A1/13.5 | B1/1.0 | C4/0.025 | — | 35 | 0.24 |
| Example 8 | A1/13.5 | B1/1.0 | C5/0.01 | — | 30 | 0.23 |
| Example 9 | A2/13.5 | B1/1.0 | C5/0.03 | D1/0.2 | 35 | 0.22 |
| Example 10 | A2/13.5 | B3/0.5 | C1/0.015 | — | 35 | 0.23 |
| Example 11 | A2/13.5 | B3/0.5 | C6/0.01 | — | 24 | 0.24 |
| Example 12 | A2/13.5 | B3/0.5 | C6/0.01 | D1/0.2 | 35 | 0.24 |
| Comparative example 1 | A1/13.5 | B1/1.0 | CA/0.1 | — | 20 | 0.30 |
| Comparative example 2 | A1/13.5 | B1/1.0 | CB/0.2 | — | 25 | 0.30 |
| Comparative example 3 | A1/13.5 | B1/1.0 | CC/0.2 | — | 25 | 0.30 |
| Comparative example 4 | A2/13.5 | B3/0.5 | CD/0.03 | — | 40 | 0.23 Reduction in film thickness is extreme |

The photo resist composition comprising the tertiary amine compound having an aliphatic hydroxyl group (C) is not easily influenced by circumstances, gives higher sensitivity, higher resolution and better profile when irradiated by a high energy radiation such as a far ultraviolet ray (including eximer laser), electron beam, X-ray and radiation light, than resists comprising other kind of amines. The photo resist of the present invention is superior in balance of these properties and can form highly precise fine photo resist pattern.

What is claimed is:

1. A positive photo resist composition comprising
   (A) a resin which is converted to alkali-soluble from alkali-insoluble or alkali-slightly soluble by the action of an acid,
   (B) an acid generator, and
   (C) a tertiary amine compound having an aliphatic hydroxyl group.

2. The composition according to claim 1, wherein the resin (A) comprises a polyvinyl phenol-based resin in which the phenolic hydroxyl group is partially protected by a group which has dissolution inhibiting ability against an alkali developer and is instable against an acid.

3. The composition according to claim 1, wherein the acid generator (B) is a compound having a diazomethanedisulfonyl skeleton or a sulfonic acid-based compound.

4. The composition according to claim 1, wherein the tertiary amine compound (C) is selected from N,N-di-substituted amino alkanol, N-substituted dialkanolamine, N,N-di-substituted amino alkanediol and trialkanolamine.

5. The composition according to claim 1, wherein the tertiary amine compound (C) is a heterocyclic compound having a tertiary nitrogen atom in the ring.

6. The composition according to claim 5, wherein the tertiary amine compound (C) is selected from N-substituted pyrrolidine compound, N-substituted piperidine compound and N-substituted morpholine compound.

7. The composition according to claim 1 which comprises 20 to 98% by weight of the resin (A), 0.05 to 20% by weight of the acid generator (B) and 0.001 to 10% by weight of the tertiary amine compound (C) based on the total solid component weight of the composition.

8. The composition according to claim 1 which further comprises an electron donor (D) having an oxidation-reduction potential of not more than 1.7 eV.

9. The composition according to claim 8 which comprises 0.001 to 10% by weight of the electron donor (D) based on the total solid component weight of the composition.

10. The composition according to claim 1, wherein the acid generator (B) is selected from the group consisting of bis (cyclohexylsulfonyl)diazomethane, bis (phenylsulfonyl) diazomethane, bis (p-tolylsulfonyl)diazomethane, bis (2,4-xylylsulfonyl)diazonethane, N- (phenylsulfonyloxy) succinimide, N- (methylsulfonyloxy)succinimide, N-(trifluoromethylsulfonyloxy)succinimide, N-(ethylsulfonyloxy)succinimide, N- (butylsulfonyloxy) succinimide, N- (10-camphorsulfonyloxy)succinimide, N-trifluoromethylsulfonyloxy)phthalimide, N-(trifluoromethylsulfonyloxy)naphthalimide, 2-nitrobenzyl p-toluenesulfonate, 4-nitrobenzyl p-toluenesulfonate, 2,6-dinitrobenzyl p-toluenesulfonate, 1,2,3-benzenetriyl trismethanesulfonate, 1-benzoyl-1-phenylmethyl p-toluenesulfonate, 2-benzoyl-2-hydroxy-2-phenylethyl p-toluenesulfonate and α- (p-tolylsulfonyloxyimino)-4-methoxyphenylacetonitrile having the following structure:

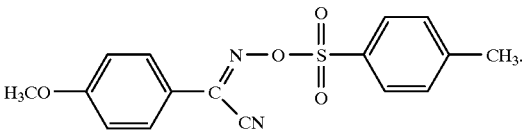

11. The composition according to claim 1, wherein the tertiary amine compound (C) is selected from the group consisting of 2- (N-methylanilino) ethanol, 2-(N-ethylanilino)ethanol, N-phenyldiethanolamine, N-phenyldiisopropanolamine, 2-diethylaminoethanol, 1-diethylamino-2-propanol, 3-diethylamino-1-propanol, 3-diethylamino-1,2-propane diol, 1-dimethylamino-2-propanol, 3-dimethylamino-1-propanol, 3-dimethylamino-1,2-propane diol, 2-dimethylamino-2-methyl-1-propanol, 3-dimethylamino-2,2-diemthyl-1-propanol, 4-dimethylamino-1-butanol, triisopropanol amine, 1-

(2-hydroxyethyl)piperidine, 1- (2-hydroxyethyl)pyrrolidine, N- (2-hydroxyethyl)morpholine, 1- (2-hydroxyethyl)-4-(3-hydroxypropyl)piperidine and 2- (2-hydroxyethyl)-1-methylpyrrolidine.

12. The composition according to claim 1, wherein the tertiary amine compound (C) is selected from the group consisting of N-phenyldiethanolamine, 2-diethylaminoethanol, 2- (N-ethylanilino)ethanol, triisopropanol amine, 1- (2-hydroxyethyl)pyrrolidine and N-(2-hydroxyethyl)morpholine.

13. The composition according to claim 1, wherein the acid generator (B) is selected from the group consisting of bis (cyclohexylsulfonyl)diazomethane, bis (phenylsulfonyl)diazomethane, bis (p-tolylsulfonyl)diazomethane, bis (2,4-xylylsulfonyl)diazonethane, N- (phenylsulfonyloxy) succinimide, N- (methylsulfonyloxy)succinimide, N-(trifluoromethylsulfonyloxy)succinimide, N-(ethylsulfonyloxy)succinimide, N- (butylsulfonyloxy)succinimide, N- (10-camphorsulfonyloxy)succinimide, N-(trifluoromethylsulfonyloxy)phthalimide, N-(trifluoromethylsulfonyloxy)naphthalimide, 2-nitrobenzyl p-toluenesulfonate, 4-nitrobenzyl p-toluenesulfonate, 2,6-dinitrobenzyl p-toluenesulfonate, 1,2,3-benzenetriyl trismethanesulfonate, 1-benzoyl-1-phenylmethyl p-toluenesulfonate, 2-benzoyl-2-hydroxy-2-phenylethyl p-toluenesulfonate and α- (p-tolylsulfonyloxyimino)-4-methoxyphenylacetonitrile having the following structure:

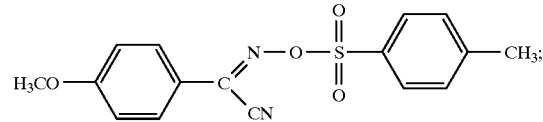

and wherein the tertiary amine compound (C) is selected from the group consisting of 2- (N-methylanilino) ethanol, 2- (N-ethylanilino)ethanol, N-phenyldiethanolamine, N-phenyldiisopropanolamine, 2-diethylaminoethanol, 1-diethylamino-2-propanol, 3-diethylamino-1-propanol, 3-diethylamino-1,2-propane diol, 1-dimethylamino-2-propanol, 3-dimethylamino-1-propanol, 3-dimethylamino-1,2-propane diol, 2-dimethylamino-2-methyl-1-propanol, 3-dimethylamino-2,2-diemthyl-1-propanol, 4-dimethylamino-1-butanol, triisopropanol amine, 1-(2-hydroxyethyl)piperidine, 1- (2-hydroxyethyl)pyrrolidine, N- (2-hydroxyethyl)morpholine, 1- (2-hydroxyethyl)-4-(3-hydroxypropyl)piperidine and 2- (2-hydroxyethyl)-1-methylpyrrolidine.

\* \* \* \* \*